US011581829B2

(12) United States Patent
Romaszko et al.

(10) Patent No.: US 11,581,829 B2
(45) Date of Patent: Feb. 14, 2023

(54) PINCH DETECTION BASED ON MOTOR CURRENT INCREASE

(71) Applicant: Aptiv Technologies Limited, St. Michael (BB)

(72) Inventors: Mateusz Romaszko, Cracow (PL); Piotr Maj, Węgrzce Wielkie (PL)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 17/523,688

(22) Filed: Nov. 10, 2021

(65) Prior Publication Data

US 2022/0158573 A1 May 19, 2022

(30) Foreign Application Priority Data

Nov. 17, 2020 (EP) ..................................... 20208153
Oct. 25, 2021 (EP) ..................................... 21204569

(51) Int. Cl.
*H02P 3/06* (2006.01)
*G01R 19/165* (2006.01)
*H02P 29/00* (2016.01)

(52) U.S. Cl.
CPC .......... *H02P 3/06* (2013.01); *G01R 19/16533* (2013.01); *H02P 29/00* (2013.01)

(58) Field of Classification Search
CPC ..... H02P 3/06; H02P 29/00; G01R 19/16533; E05F 15/41; E05F 15/42; E05F 15/48
See application file for complete search history.

(56) References Cited

U.S. PATENT DOCUMENTS 4,641,067 A * 2/1987 Iizawa ...................... H02P 7/03
　　　　　　　　　　　　　　　　　　　　　　318/287
5,399,950 A * 3/1995 Lu ......................... H02H 7/0851
　　　　　　　　　　　　　　　　　　　　　　318/434

(Continued)

FOREIGN PATENT DOCUMENTS

CN　　　101220724　　　7/2008
CN　　　202899882　　　4/2013
(Continued)

OTHER PUBLICATIONS

"Extended European Search Report", EP Application No. 20208153.5, dated May 11, 2021, 7 pages.
(Continued)

*Primary Examiner* — Rina I Duda
(74) *Attorney, Agent, or Firm* — Sawtooth Patent Group PLLC

(57) ABSTRACT

The pinch detector is suitable to detect a pinch at a closing member actuated by a motor equipped with a measuring circuit to measure a motor current. It includes a first portion that, when the motor starts closing the member, obtains a reference value of the motor current measured at the end of a blind time period having a predetermined duration from the moment the motor starts to close the member; a second portion that compares current values of the measured motor current to a threshold value depending on said reference value, during a detection time period, following the blind time period and preceding a steady state time period of the motor, in order to detect a pinch at the closing member based on a comparison result.

20 Claims, 8 Drawing Sheets

(56) References Cited

U.S. PATENT DOCUMENTS

| | | | |
|---|---|---|---|
| 5,734,245 A * | 3/1998 | Terashima | G05B 19/4061 318/453 |
| 5,977,732 A | 11/1999 | Matsumoto | |
| 6,051,945 A | 4/2000 | Furukawa | |
| 6,239,610 B1 | 5/2001 | Knecht et al. | |
| 6,362,584 B1 * | 3/2002 | Rogovin | H02H 7/0851 318/467 |
| 6,794,837 B1 | 9/2004 | Whinnery et al. | |
| 8,620,531 B2 | 12/2013 | Morawek | |
| 10,337,230 B2 | 7/2019 | Kigoshi et al. | |
| 2002/0101210 A1 | 8/2002 | Boisvert et al. | |
| 2003/0051555 A1 | 3/2003 | Fukumura et al. | |
| 2005/0187688 A1 | 8/2005 | Bigorra et al. | |
| 2008/0079379 A1 * | 4/2008 | Odland | H02P 3/08 318/469 |
| 2009/0056385 A1 | 3/2009 | Maekawa | |
| 2011/0265381 A1 * | 11/2011 | Guarnizo | H02H 7/0851 318/446 |
| 2012/0032618 A1 | 2/2012 | Stoeger | |
| 2014/0173984 A1 | 6/2014 | Schlesiger et al. | |
| 2014/0239867 A1 | 8/2014 | Bessho et al. | |

FOREIGN PATENT DOCUMENTS

| | | |
|---|---|---|
| DE | 19601359 | 7/1997 |
| DE | 102009028914 | 3/2011 |
| DE | 102012011117 | 12/2013 |
| EP | 0692856 | 1/1996 |
| EP | 2175330 | 4/2010 |

OTHER PUBLICATIONS

"Extended European Search Report", EP Application No. 21204569.4, dated Mar. 21, 2022, 8 pages.

"Extended European Search Report", EP Application No. 20208151.9, dated Apr. 28, 2021, 7 pages.

"Extended European Search Report", EP Application No. 20208149.3, dated Apr. 30, 2021, 6 pages.

"Extended European Search Report", EP Application No. 20208150.1, dated Apr. 30, 2021, 7 pages.

"Extended European Search Report", EP Application No. 20208152.7, dated May 3, 2021, 6 pages.

* cited by examiner

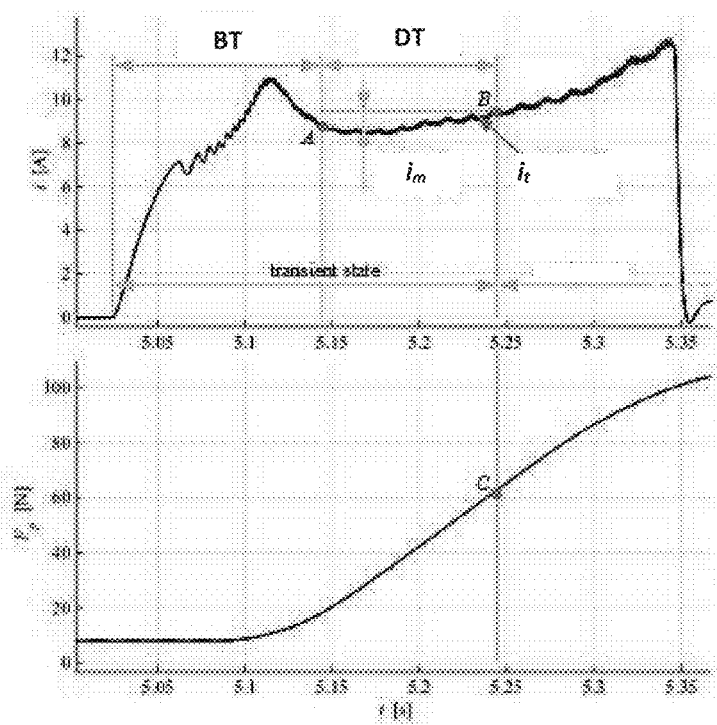
Fig. 6a
Fig. 6b
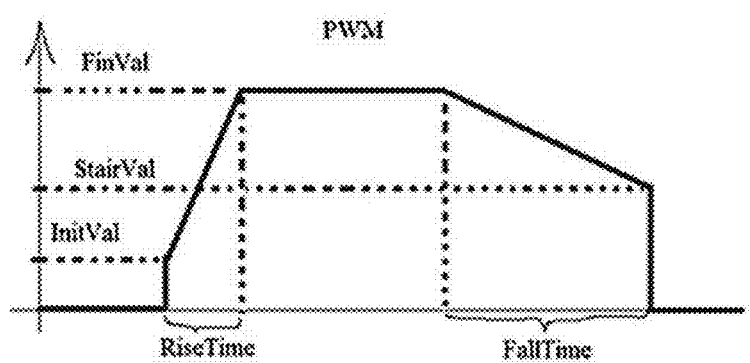
Fig. 7

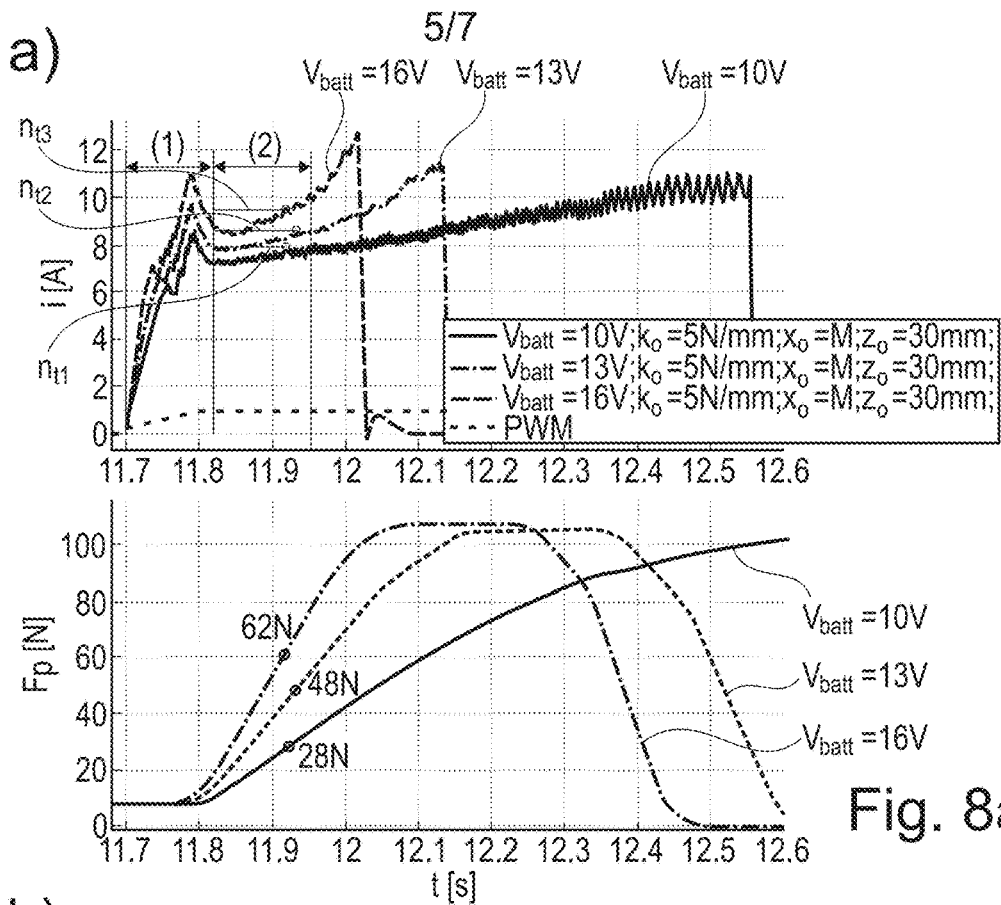
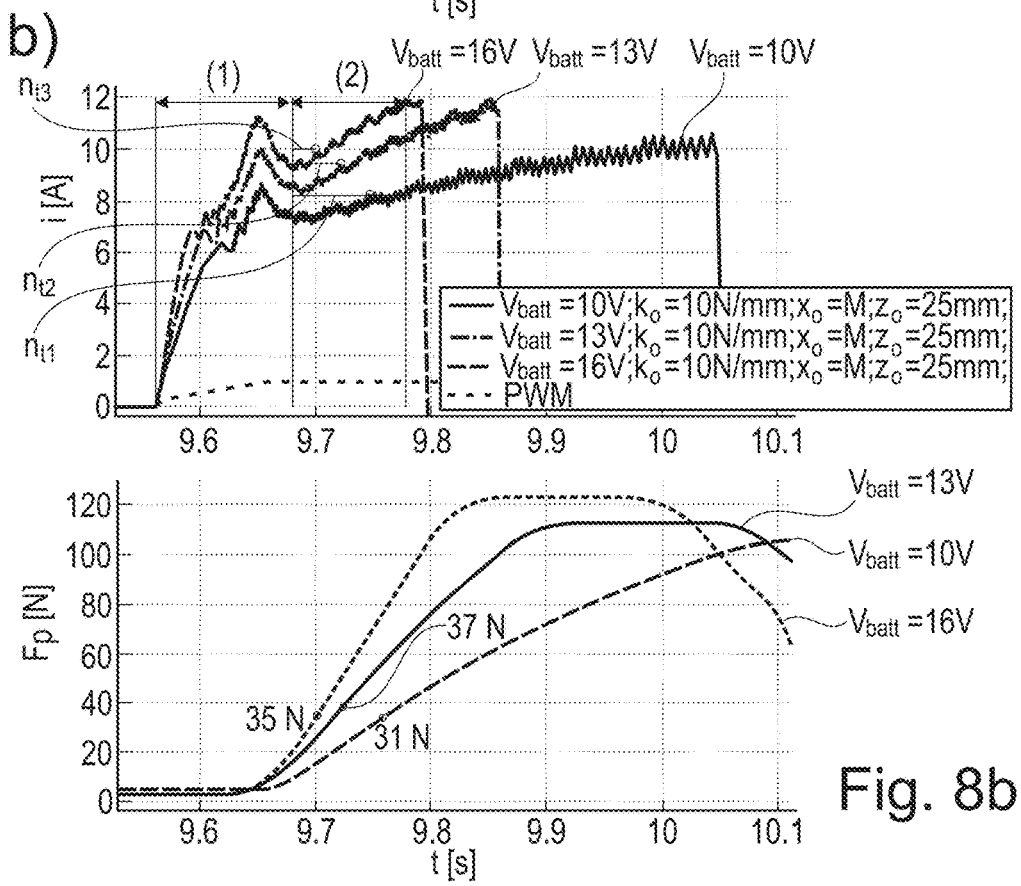
Fig. 8a
Fig. 8b

PINCH DETECTION BASED ON MOTOR CURRENT INCREASE

CROSS-REFERENCE TO RELATED APPLICATIONS

This application claims priority to European Patent Application Number 21204569.4, filed Oct. 25, 2021, and European Patent Application Number 20208153.5, filed Nov. 17, 2020, the disclosures of which are hereby incorporated by reference in their entireties herein.

BACKGROUND

The present disclosure relates to the field of closing member actuated by a motor, especially members such as power windows, sliding doors or sliding roofs in vehicles, which are provided with an anti-pinch detector to provide protection against injuries. More specifically, the present disclosure relates to a pinch detector suitable to detect a pinch at a closing member, a control apparatus for controlling the closing member actuated by a motor, and a method to detect a pinch at a closing member.

Power windows (i.e., windows activated by an electric motor) are getting very popular nowadays, even in low-range vehicles.

It happens that children try to put their neck or hands out through the window. If anyone operates the window switch to close the window at the same time, it may cause suffocation or injuries to the child. The risk also arises in case of power windows which are programmed to operate without even the need to press the switch, for example when a global closing function is activated.

Windows are moved with clamping forces of up to 350 N. This means that a thin glass plate of only about 8 mm thickness can press up to 35 kg (e.g. onto a child's hand or head). It takes only 98 N to suffocate or injure a small child. To avoid such mishaps, an anti-pinch technology has been developed.

The anti-pinch technology of a power window has to meet standards for example issued by the European Union and/or the United States. According to known standards, the maximum force a power window is allowed to exert on any object is 100 N and compliance with this limit must be monitored and enforced in a range $z_0$ of 4 mm to 200 mm minimum from the top window frame, as shown in FIG. 1. It is also important to deactivate the anti-pinch algorithm immediately before the window seal is reached (distance 4 mm from top seal), so that the window can close completely. In addition, to avoid overload and damage to the window motor, blocking must not last too long.

Document US 2014/239867 A1 discloses a pinch detection apparatus for an opening and closing member actuated by a motor which comprises a reference data storage portion calculating load data on the basis of a rotation speed of the motor and an environmental temperature.

Document US 2003/051555 A1 discloses a pinch detection system based on the calculation of reference motor torque using voltage and speed measurements. To this end, it requires at least one dedicated speed sensor, such as an encoder or a Hall effect sensor, that determines the rotational speed of the motor. A voltage sensor provides information to a force calculator which calculates the motor force. A difference between an actual force and a reference force can thus be determined. A pinch condition is indicated if the force difference exceeds a predetermined threshold.

Document U.S. Pat. No. 6,239,610 B1 discloses a solution based on the voltage induced in the armature motor of the electric drive system used for moving the window.

Lots of known solutions require an additional equipment such as force or speed sensors, which involves an additional cost, require more space in a relatively constrained environment and does not allow to increase the reliability of the entire system.

Document CN101220724A discloses an anti-pinch device for a power window requiring no additional sensor. A motor current signal is obtained, and it is judged whether or not the motion of the window is obstructed by an obstacle according to the current and using a constant current threshold.

The most difficult scenario for pinch detection is detection of an obstacle (e.g. a body part such as a finger, hand, arm, etc.) that is squeezed as soon as the motor starts. FIG. 2 schematically illustrates an example of such a window movement scenario. In a step 1, the window is completely closed. Then, the window is opened. In a next step 2, the window is closed but stopped in an intermediate position not completely closed, as shown in a step 3. In this step 3, when the window is stopped temporarily in its intermediate position not completely closed, an object (obstacle) is placed in the space left between the window and the window frame of the door. The object is placed in such a way that, when the window starts closing again, in a step 4, it is squeezed immediately by the window. At this moment, during the motor start-up, the motor actuating the window has an additional load due to the presence of the object that is squeezed.

There are no unambiguous and reliable ways to capture characteristic changes of physical values of the motor, such as the motor current flowing in an armature of the motor or the motor speed, during the motor start-up (step 4 in FIG. 2), when transient phenomena dominate. During the motor start-up, the motor operates in transient state: the motor current and/or motor speed change dynamically and in an unpredictable manner. These changes depend on factors such as supply voltage, temperature, and window position (different gasket resistance). Therefore, pinch detection in such conditions is very difficult. Detecting a pinch in a transient state of the motor, typically in a situation in which, after being stopped temporarily in an intermediate position not completely closed, the window starts closing again, in order to avoid exceeding the limit value of pinch force (e.g. 100 N), is a very challenging task.

Accordingly, there is a need for improving existing anti-pinch solutions in order to at least partially overcome the aforementioned issues and drawbacks.

SUMMARY

The present disclosure concerns a pinch detector suitable to detect a pinch at a closing member actuated by a motor equipped with a measuring circuit to measure a motor current, including a first portion that, when the motor starts closing the member, obtains a reference value of the motor current measured at the end of a blind time period having a predetermined duration from the moment the motor starts to close the member; and a second portion that compares current values of the measured motor current to a threshold value depending on said reference value, during a detection time period, following the blind time period and preceding a steady state time period of the motor, in order to detect a pinch at the closing member based on a comparison result.

The present pinch detector can efficiently detect the occurrence of a pinch at the closing member during motor start-up as soon as the motor starts. For example, it can detect a pinch in the critical member movement scenario explained thereafter, that can be considered as the most difficult scenario for an anti-pinch algorithm: the member is being closed but is temporarily stopped in an intermediate position not completely closed, then it is completely closed. When the member is stationary in its intermediate position not completed closed, an obstacle is likely to be placed in the space left between the member and the member frame.

The present pinch detector determines a reference value of the motor current by picking the current value measured at the end of the blind time period starting when the motor starts to move the member. During this blind time period (early or initial stage of the motor start up), the motor current shows generally a current peak. The reference value of the motor current is a current measured just after (or at the end of) this current peak.

The pinch detector then uses this reference value to detect the occurrence of a pinch in the detection time period, that follows the blind time period, typically in transient state of the motor.

Such an approach to detect a pinch at the closing member is very simple, fast, and robust with respect to various external conditions (supply voltage, obstacle stiffness, etc.).

In some embodiments, the motor being supplied in power by a PWM (Pulse-Width Modulation) signal, the predetermined duration of the blind time period is set by duration of a rise time period of a PWM duty cycle of the PWM signal during the motor start-up. In other embodiments, wherein the rise time period of the PWM duty cycle is very short (i.e., below a certain minimum value), the duration of the blind time period is set to a value that is more than the duration of the rise time period.

The first portion of the pinch detector can determine the threshold value by adding a current margin value to the reference value.

The first portion can calculate the current margin value by multiplying by said reference value with a predetermined correction factor.

Advantageously, the first portion uses a correction factor that is set to a value between 0.1 and 0.3.

The present disclosure also concerns a control apparatus for controlling an opening and closing member actuated by a motor equipped with a measuring circuit to measure a motor current, including a pinch detector as previously defined, and a portion that generates a control signal to control at least one of the two actions of stopping the member and reversing the direction of movement of the member, when a pinch is detected.

The present disclosure also concerns a system including an opening and closing member; a motor for activating the member; a measuring circuit to measure a motor current of the motor; and a control apparatus as above defined.

The present disclosure also concerns a method to detect a pinch at a closing member actuated by a motor equipped with a measuring circuit to measure a motor current, including the two following successive steps: when the motor starts closing the member, a step of determining a reference value of the motor current measured at the end of a blind time period having a predetermined duration from the moment the motor starts to close the member; and a pinch detection step in which the current values of the measured physical quantity of the motor are compared to a threshold value depending on said reference value, during a pinch detection time period following the blind time period and preceding a steady state time period of the motor, in order to detect a pinch at the closing member based on a comparison result.

In some embodiments, the motor being supplied in power by a PWM signal, the predetermined duration of the blind time period can be set by the duration of a rise time period of a duty cycle of the PWM signal during the motor start-up. In other embodiments, the predetermined duration of the blind time period can be set to a value more that the duration of the rise time period of the PWM duty cycle. In particular, when the rise time period of the PWM duty cycle is very short (i.e., below a certain minimum value), the duration of the blind time period is set to a value that is more than the duration of the rise time period of the PWM duty cycle.

The threshold value can be determined by adding a current margin value to the reference value. This current margin value can be calculated by multiplying by said reference value with a predetermined correction factor. Advantageously, the correction factor is set to a value between 0.1 and 0.3.

The present disclosure also concerns a non-transitory computer readable medium including program instructions which, when executed by a processor, cause the processor to execute the method as previously defined.

BRIEF DESCRIPTION OF THE DRAWINGS

Other features, purposes and advantages of the disclosure will become more explicit by means of reading the detailed statement of the non-restrictive embodiments made with reference to the accompanying drawings.

FIGS. 6a and 6b illustrate a pinch detection in a scenario of closing a window, respectively with an obstacle, and show the evolution over time of the motor armature current i and pinch force $F_P$, according to the Embodiment 1 of the disclosed pinch detection method.

FIG. 7 shows an example of the evolution over time of the duty cycle of a PWM signal for supplying power to a DC motor actuating an opening and closing member and controlling a DC motor start and stop operation.

FIGS. 8a to 8d show the evolution over time of the motor armature current and the pinch force, in a scenario of closing the window at various battery voltages, for obstacles having various stiffnesses and positions without any obstacle, in the Embodiment 1.

DETAILED DESCRIPTION

The present disclosure relates to pinch detection to detect a pinch at a closing member actuated by a motor (for example a power window in a vehicle) and is more precisely dedicated to pinch detection during a closing movement of the member, when the member starts moving, typically in a transient state of the motor during a motor start-up operation.

In the present description, the "transient state" of the motor refers to the period of time when one or more physical values of the motor are changing rapidly during the motor start-up, before reaching a steady state. Transient state can be determined experimentally. Typically, in transient state, the motor current and/or the motor speed are changing rapidly. In normal operation, the transient state is followed by a steady state in which the motor current and the motor speed are almost constant (small fluctuations may be observed but no dynamic changes). In most cases steady-state begins when physical quantities (armature current, speed) of the motor do not show significant changes (no dynamic changes only small fluctuations in physical quantities).

Figure 3A:
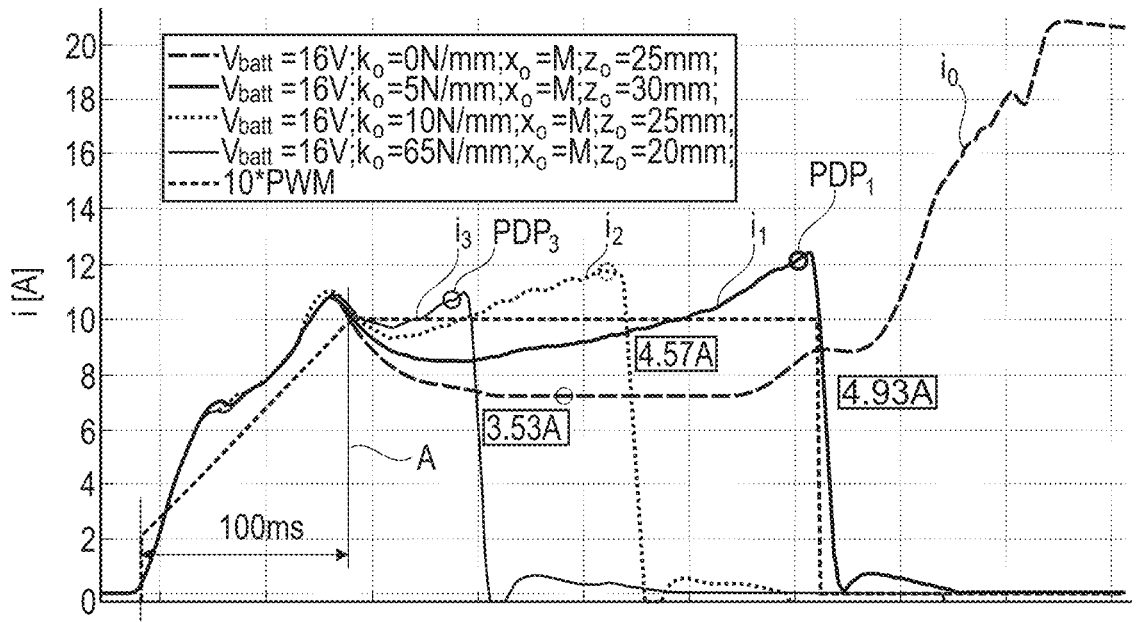
FIGS. 3a and 3b show graphs representing the motor armature current and the pinch force, when the motor starts to close a window in a vehicle, for different external conditions, with or without obstacles, without pinch detection.
Figure 3B:
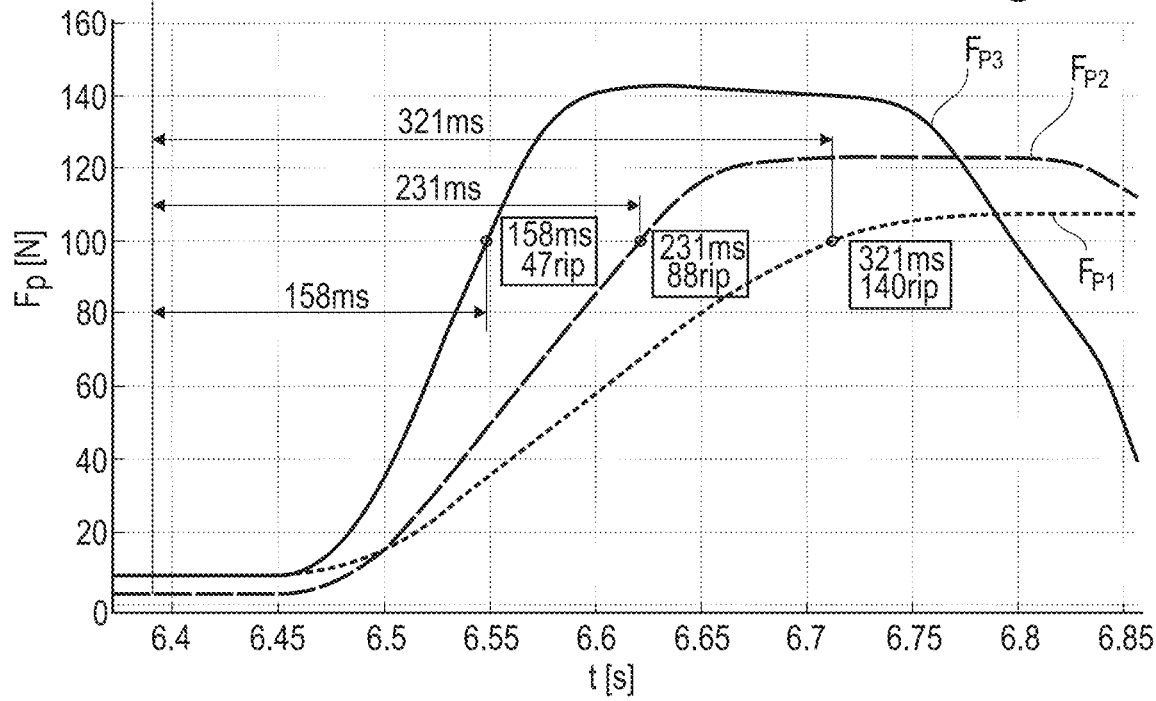

FIG. 3a shows the evolution over time of a motor current "i" (or current density) of a motor actuating a member (e.g. a window in a vehicle) during closing the member, when the member starts moving, typically in a transient state of the motor, for different external conditions (explained thereafter). In three cases represented in FIG. 3a, the window starts closing from an intermediate position not completely closed after an obstacle having different stiffnesses of 5, 10 and 65 N/mm has been placed in the space left between the window and the window frame, for example in the middle between front and rear window frame. FIG. 3b represents the evolution over time of the pinch force "$F_P$" squeezing the obstacle, referenced as $F_{P1}$, $F_{P2}$, $F_{P3}$ for the three cases, respectively. In a fourth case represented in FIG. 3a, the same window movement is executed but without obstacle ($k_O$=0 N/mm). The evolution over time of a duty cycle of a PWM (Pulse-Width Modulation) electrical signal for supplying power to the motor is also represented in FIG. 3a. It can be seen that the maximal PWM duty cycle is reached within about 100 ms from the initial time point of starting the motor.

FIG. 3a shows that, in all four cases, when the motor starts, the motor current $i_0$, $i_1$, $i_2$, $i_3$ increases and then there is a peak of current. Until the end of these current peaks, the evolutions over time of the currents are similar in all four cases. In FIG. 3a, it can be seen that the rise time (100 ms) of the PWM duty cycle coincides with the end of the current peak. After the current peak, when squeezing the obstacle with the stiffnesses of 5, 10 or 65 N/mm, the current $i_1$, $i_2$, $i_3$ increases again. Without obstacle, after the current peak, the current $i_0$ becomes almost stationary around a neutral current level (7.2 A in the example), for a certain period of time before reaching the completely closed position. In FIG. 3a in case that $k_O$=0 (no obstacle), the steady-state begins for time point 6.59 sec marked by an empty dot. This empty dot is used to determine the neutral level.

The current increase with respect to the neutral level $i_0$ (around 7.2 A) is 3.53 A, 4.57 A, 4.98 A for the respective stiffnesses of 65, 10, 5 N/mm. It means that 3.53 A is an increase from the stationary level $i_0$ to $i_3$ when Fp=100 N is reached (at time t=6.54 s); 4.57 A is an increase from the stationary level $i_0$ to $i_2$ when Fp=100 N is reached (at time t=6.62 s); 4.98 A is an increase from the stationary level $i_0$ to $i_1$ when Fp=100 N is reached (at time t=6.71 s).

In FIG. 3b, the pinch force rise time from the time point of starting the motor to the time point of reaching a limit pinch force of 100 N is indicated. This time is 158, 231 and 321 ms for obstacle stiffnesses of 65, 10, 5 N/mm, respectively.

The experiments illustrated by FIGS. 3a and 3b clearly show that, in the first (early) stage of starting the motor and for a duration of about 100 ms, all four transient states (with or without obstacle) are almost identical. This period of time generally corresponds to the rise time of the PWM duty cycle.

The differences appear only after reaching the maximal PWM duty cycle. However, in the worst situation, it is less than 60 ms before the pinch force reaches the limit value of 100 N.

The present disclosure allows to achieve detection of a pinch (i.e. a squeezed obstacle) at a closing member 1 actuated by a motor 2 when the motor 2 starts, advantageously during a transient state of the motor 2. For example, it allows detection when the motor restarts to completely close the member 1, after the member has been moved (in a closing or opening movement) and temporarily stopped in a position not completely closed. For example, the pinch detection can be carried out in the scenarios described with reference to FIGS. 3a, 3b, before reaching the pinch force limit of 100 N.

The member 1 is movable between a closed position and an open position, typically in translation (or in rotation). It can open and close and can there be qualified as an opening and closing member. For example, the member 1 is a power window in a vehicle. However, the present disclosure is not limited to a power window but can apply to other types of closing movable (opening and closing) members (e.g. sliding door or sliding roof in a vehicle, sliding door of a garage, etc.).

Figure 4:
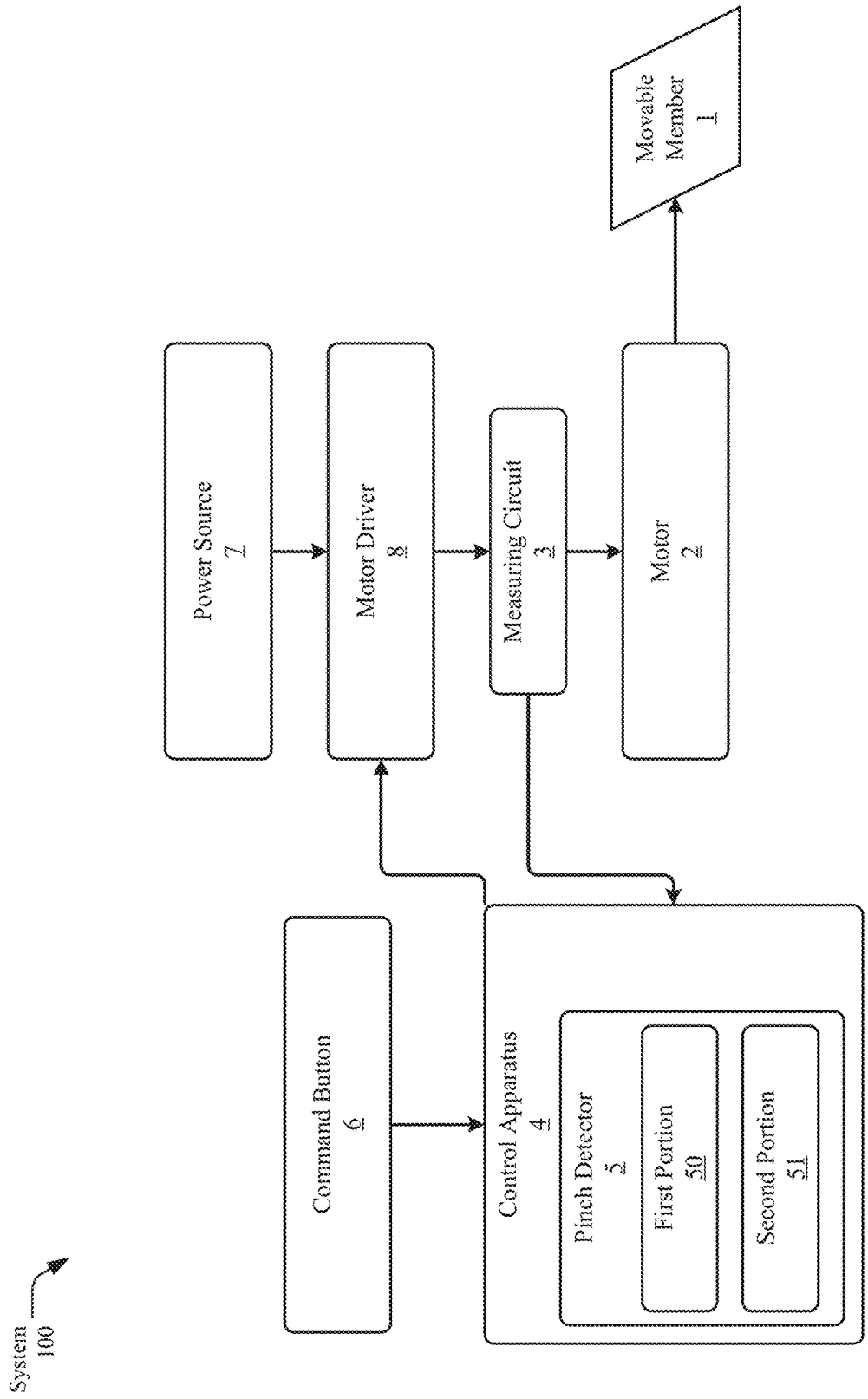
FIG. 4 represents schematically a system for pinch detection, according to a particular example.

FIG. 4 represents a system 100 including the following elements: the movable member 1 (e.g. a power window in a vehicle), a motor 2 for actuating the member 1, a measuring circuit 3 (or measuring device, or sensor) to measure a physical quantity of the motor 2 (here, the motor current), a control apparatus 4 for controlling the motor 2, a pinch detector 5 for pinch detection at the closing member 1.

The pinch detector 5 can be part of the control apparatus 4. In operation, it implements the method (or algorithm) of pinch detection, described below, to detect a pinch at the closing member 1.

A user interface means can also be provided to enter user commands, for example to stop or move the member 1. It can include for example a window command button 6 that can be pressed up to move up the window 1 or pressed down to move down the window 1.

The system 100 also includes a power source 7, e.g. an electrical battery, for supplying the motor 2, and a motor driver 8. In some embodiments, the motor driver is equipped with a PWM controller that can be used to control supplying power as a PWM signal to the motor 2. The control apparatus 4 controls the motor 2 via the motor driver 8. The control apparatus 4 has a portion 40 that generates a control signal to control the movement of the member 1. For example, when a pinch is detected, the portion 40 generates a control signal to stop the member and/or reverse the direction of movement of the member.

The motor 2 is equipped with the measuring circuit 3 to measure a physical quantity (or physical value) of the motor 2, here a motor current, such as an armature current flowing through the DC motor windings. The measuring circuit 3 measures values of the motor current at successive times, for example with a predetermined measurement frequency. The successive points (or values) of the motor current are sent to the control apparatus 4.

The control apparatus 4 controls the motor 2 through the motor driver 8, to move the member 1.

Embodiment 1

Figure 5:
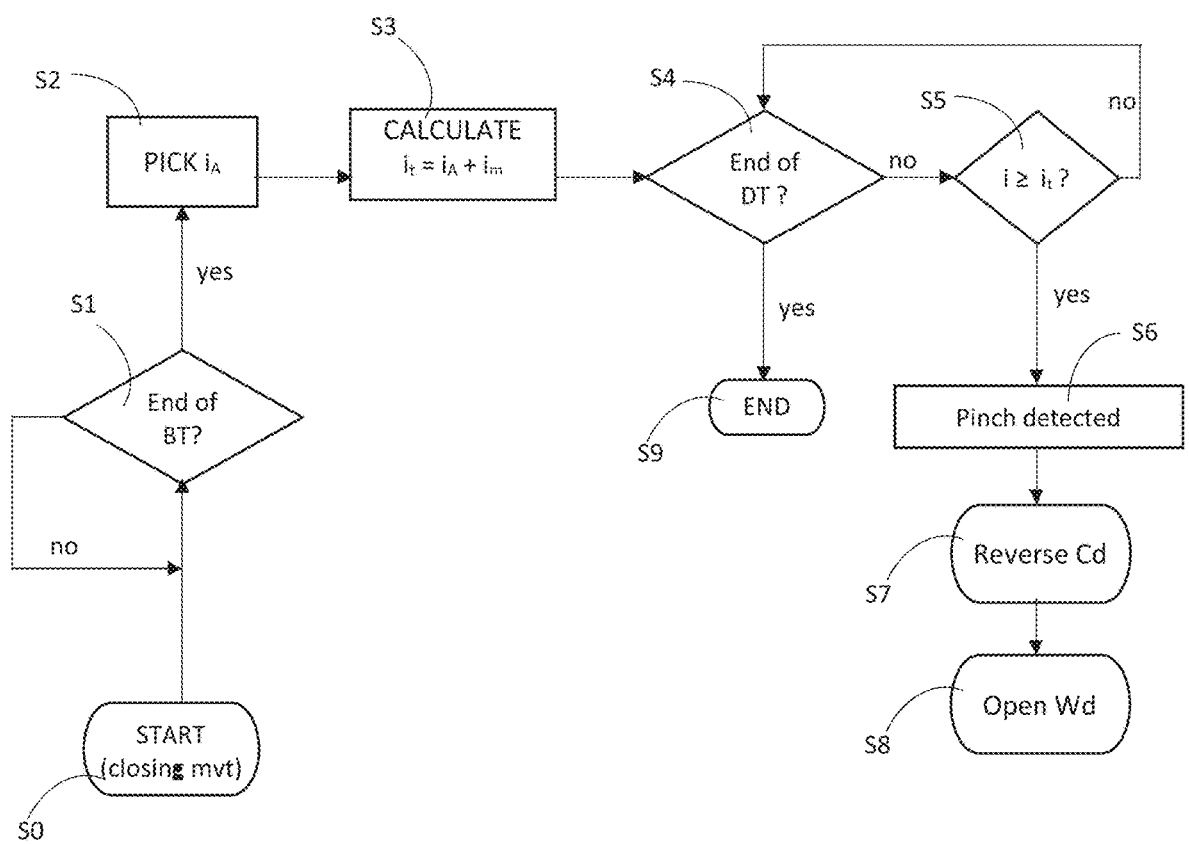
FIG. 5 is a flow chart of the method of pinch detection, according to an Embodiment 1.
Figure 8C:
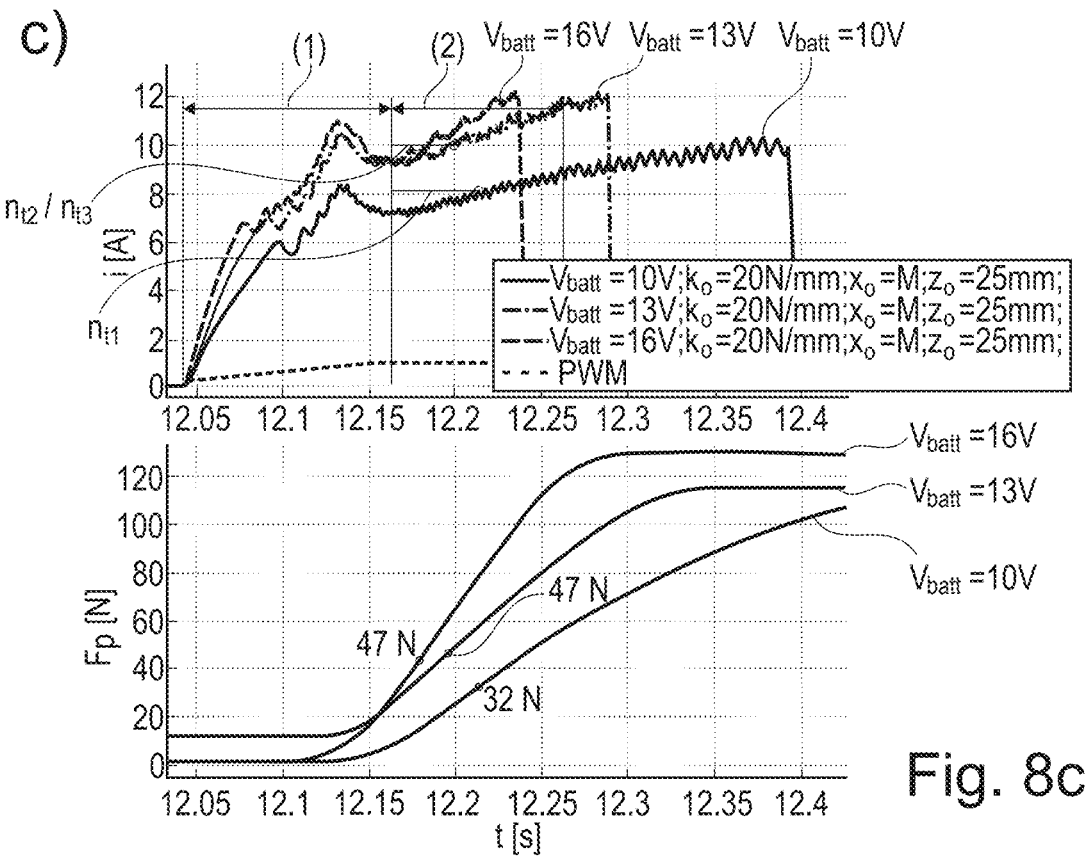
Figure 8D:
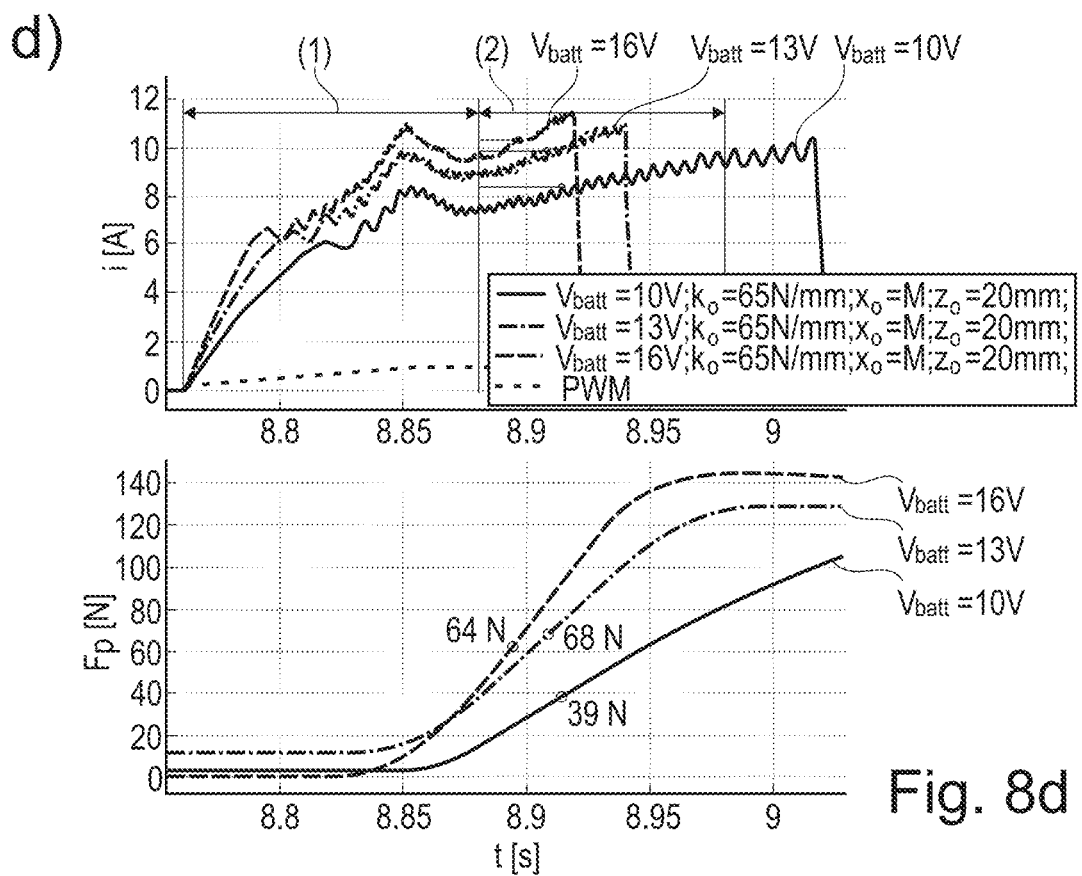

FIG. 5 represents schematically the method of pinch detection to detect a pinch at the closing member 1 according to an Embodiment 1. For example, the member 1 is a window in a vehicle.

It is assumed that the member 1 is initially stationary in a position not closed, for example an intermediate position not completely closed.

In a start step S0, under control of a closing command, the motor 2 starts to move the member 1 in a closing movement. The closing command can be entered by a user by pushing up the window command button 6. Optionally, the vehicle can also have a function of global closing, that commands the automatic closing of all the vehicle windows when the user leaves and closes the vehicle.

In a first test step S1, the pinch detector 5 determines whether or not a blind time BT period has elapsed since the motor 2 started to close the window in the step S1. The duration of the blind time period is predetermined, for example in a preliminary calibration step that is further explained later, and fixed. The blind time (duration of the blind time period) does not vary significantly during the lifetime of the vehicle.

In a particular embodiment, electrical power is supplied to the motor 2 as a PWM signal characterized by a frequency and a PWM duty cycle. The PWM duty cycle can vary during the motor operation. For example, FIG. 7 shows an example of the evolution over time of the PWM duty cycle of a PWM signal for controlling a DC motor start and stop operation. The PWM duty cycle increases from an initial value (0% or more) to a final value, that is usually 100% (but can be less than 100%), when the motor starts. Then, it is stationary when the motor 2 operates at full speed and it finally decreases before stopping. The duration of the blind time period can be set as equal to the rise time of the PWM duty cycle, as shown in FIG. 3a. However, the duration of the blind time period can be set to a value that is different from the rise time period of the PWM duty cycle. It can be more that the rise time period of the PWM duty cycle. In particular, in some embodiments, the rise time period of the PWM duty cycle is short, below a given minimum value, and, in that case, the duration of the blind time period can be set to a value that is more than the duration of the rise time period. This minimum value of the rise time period of the PWM duty cycle can be determined experimentally, in a calibration process.

The test S1 is repeated during the predetermined blind time duration (branch 'no').

At the end of the blind time period (i.e., when the blind time duration has elapsed, branch 'yes'), the pinch detector 5 requests and obtains a reference value '$i_A$' of the motor current of the motor 2 measured by the measuring circuit 3 at the end of the blind time period, in a step S2.

FIG. 6a shows the evolution over time of the motor current i from the moment the motor starts in step S0 (time point 5 sec). The blind time BT period is also represented. The reference value of electrical current $i_A$ picked by the pinch detector 5 at the end of the blind time period is referenced as point 'A' in FIG. 6A. FIG. 6b shows the parallel evolution over time of the pinch force $F_P$ when an object is squeezed by the member 1 during its closing.

In a calculation step S3, the pinch detector 5 calculates a current threshold value $i_t$ depending on the reference value $i_A$ of the motor current, grabbed in step S1. The calculation of this threshold value $i_t$ can consist in adding to this reference value $i_A$ a margin value of current $i_m$, according to the following equation:

$$i_t = i_A + i_m$$

For example, the margin value $i_m$ is equal to a correction factor multiplied by the reference value $i_A$ of the motor current. The correction factor can be comprised between 0.1 and 0.3. For example, it is equal to 0.15. Alternatively, the margin value $i_m$ can be fixed and predetermined during a calibration step.

The blind time BT period is immediately (directly) followed by a detection time period, referenced as DT in FIG. 6A. The duration of the detection time period can be fixed and predetermined in a calibration process. The detection time DT does not vary significantly during the lifetime of the vehicle either. It can depend on the voltage supplied to the motor and thus on the speed of the member 1.

The preliminary calibration step allows to predetermine the duration of the blind time period and the duration of the detection time period.

When the motor 2 starts closing the window, in an early phase of the motor start up, the motor current profile (over time) includes a current peak. Furthermore, in this early phase of the motor start up (for a given voltage battery), current profiles corresponding to different obstacle stiffnesses are merged or roughly (approximately) merged. Then, the current profiles corresponding to different obstacle stiffnesses separate (in other words: diverge from one another). The phenomenon is illustrated for example in FIG. 3a. The blind time BT period starts when the window starts closing and ends when different current profiles (over time), corresponding to different obstacle stiffnesses, separate (in other words: start diverging). The vertical line A in FIG. 3a corresponds to a point in time—termed as a separation point—from which the current profiles corresponding to different obstacle stiffnesses are considered to separate or diverge over time.

In a preliminary calibration step, the blind time (in other words: the length or duration of the BT period) can be determined by determining a separation point A in time (as represented in FIG. 3a) from which different current profiles corresponding to different obstacle stiffnesses are no longer grouped or approximately grouped (in other words: merged or roughly merged) and start separating (diverging), preferably for a given battery voltage. For example, data related to different current profiles corresponding to different obstacle stiffnesses are measured over time and recorded for extreme voltage values $V_{batt}$ of a supply battery, for example 10 V (which results in a very slow movement of the window 1) and 16 V (which result in a high speed movement of the window 1), and for various conditions related to the obstacle: no obstacle, an obstacle with a very low stiffness (e.g., $k_0$=5 N/mm), and an obstacle with a very high stiffness (e.g., $k_0$=65 N/mm). In the calibration step, the obstacle can be a spring having a known stiffness.

In the preliminary calibration step, after recording data related to different current profiles corresponding to different obstacle stiffnesses and determining the separation point A in time, a corresponding threshold value $i_t$ is determined for each recorded current profile using the expression $i_t=i_A+i_m$, where $i_A$ represents the current value at point A in time and $i_m$ represents a margin value. The current value $i_A$ depends on the current profile (in other words: on the obstacle stiffness). The current profiles for different obstacle stiffnesses are grouped but they are not exactly all the same during the blind time period. Consequently, the current value $i_A$ for a first obstacle stiffness and the current value $i_A$ for a second obstacle stiffness (different from the first obstacle stiffness) can be slightly different. The margin value $i_m$ can be fixed and determined in the calibration step. For example, it can be calculated by multiplying the current $i_A$ for one of the recorded current profiles by the correction factor comprised between 0.1 and 0.3. As an illustrative and non-limitative example, the margin value $i_m$ is equal to the current value $i_A$ for the current profile corresponding to the highest obstacle stiffness (65 N/mm) multiplied by 0.1.

Then, from recorded data of the current profiles corresponding to the lowest obstacle stiffness (e.g., $k_0$=5 N/mm) and the highest obstacle stiffness (e.g., $k_0$=65 N/mm), two pinch detection points (referenced as $PDP_1$ and $PDP_3$ in FIG. 3a) from which the current value i exceeds the corresponding current threshold $i_t$ are determined. It is checked that the corresponding values of the pinch force $F_P$ do not exceed a permissible maximum force value, for example 100 N. Optionally, the corresponding values of the pinch force $F_P$ should not exceed 70% of the permissible maximum force value, i.e. not more than 70 N. Then, the detection time (in other words: the length or duration of the detection time period immediately following the blind time period) is determined so as to cover (in other words: include) the two determined detection points $PDP_1$ and $PDP_3$ corresponding to the lowest obstacle stiffness and the highest obstacle stiffness.

Figure 1:
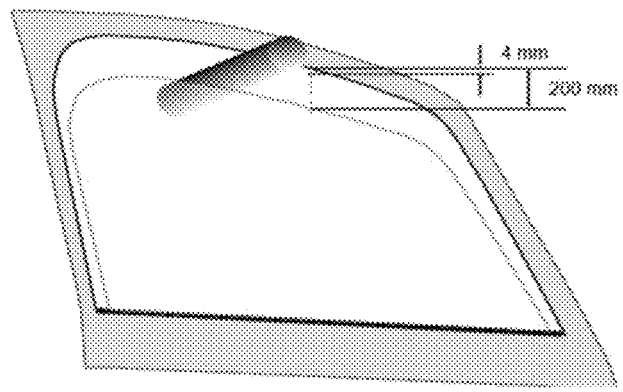
FIG. 1 shows an obstacle placed in a space left between a window and a door frame, in a vehicle, and a range of vertical positions in which compliance with a limit of pinch force defined by standards must be monitored.

In an embodiment, the detection time period starts when the blind time period ends, and ends when the pinch detection point PDP1 for the lowest obstacle stiffness is reached (or, alternatively, X ms after the pinch detection point $PDP_1$ for the lowest obstacle stiffness, X representing a safety margin that is for example set to a predetermined value between 10 and 60 ms, like 50 ms). In the present example, the lowest obstacle stiffness is 5 N/mm. This value is derived from requirements of standards governing the automotive power-operated windows, like MVSS118 in USA or 74/60/EEC in Europe. The requirements expressed in these standards include a detection area between 4 mm and 200 mm as illustrated in FIG. 1, a maximum pinch force of 100 N, a reverse direction on a pinch, and tests with determined deflection ratio objects between 5 N/mm and 20 N/mm. Thus, the value of the lowest obstacle stiffness can be set according to standards related to pinch detection at a closing member, like an automotive power-operated window. Alternatively, the lowest obstacle stiffness can be set to a value that is strictly more than 0 N/mm and less than 10 N/mm.

In a variant, in case that the system for controlling the window uses a soft start based on a soft increase of the motor power, the blind time BT can be set equal to the increase time of the motor power (typically an increase time of a PWM signal controlling the supplied power). Additionally, it can be checked that the end of the blind time matches the separation point A in time as previously defined.

The preliminary calibration step for configuring the blind time BT and the detection time can be performed before a first use of the vehicle, in a manufacturing phase. Optionally, the preliminary calibration step is carried out on one system of a model and applied to all systems (including the system 100) of this model.

In an embodiment, the blind time BT and the detection time DT are calculated automatically on the system 100 installed in the vehicle by recording data related to different current profiles over time, corresponding to different obstacle stiffnesses (advantageously for one battery voltage). The system 100 automatically searches the separation point A in time from which the different current profiles separate (in other words: diverge) using the recorded data. Then, the system 100 derives the blind time BT and the detection time DT from the recorded data, using the separation point A in time.

The durations of the blind time BT period and the detection period DT are determined by experiments in such a manner that the detection algorithm correctly detects the pinch for the limit values (max, min).

During calibration, the pinch detection algorithm is tested using a special device called a pinch meter. It gives the possibility of testing by simulating objects of different flexibility. This is achieved by selecting a spring with the appropriate stiffness in the pinch meter. The calibration can be performed before production of the detector pinch.

During the detection time DT period, a test step S4 in which it is determined whether or not the detection time period has elapsed is repeated in loop.

During the detection time DT period, a comparison step S5 is performed (after branch 'no' in step S4), during which the current values i of the measured motor current are compared to the threshold value $i_t$ calculated in step S3.

As long as the current value i of the motor current is less than the threshold value $i_t$ in step S5, the method goes back to the test step S4.

If the current value i of the motor current is equal or more than the threshold value $i_t$ (branch 'yes' in step S5), a pinch is detected in a step S6. In FIG. 6a, the detection of a pinch is illustrated by a point "B", here at the end of the detection time period. In the example illustrated in FIGS. 6a-6b, when a pinch is detected (point B), a reverse movement of the member is not activated (indeed, the measured pinch force is still increasing on the bottom graph of FIG. 6b). When the pinch is detected (point B), the pinch force $F_P$ is equal to only 60 N.

In case that a pinch is detected based on the comparison result of step S5, the pinch detector 4 sends a command to reverse the movement of the member 1 (i.e. to change its closing movement into an opening movement), in a step S7. Then, the control apparatus 4 generates a control signal to reverse the direction of movement of the member 1, so that the member 1 opens in a step S8. Alternatively, the control apparatus 4 could generate a control signal to stop the member 1.

If no pinch is detected during the detection time period, the pinch detection method ends in a step S9.

With reference to FIG. 4, the pinch detector 5 has a first portion 50 that executes the steps S0 to S3, and a second portion 51 that executes the steps S4 to S6. The step S7 is executed by the control apparatus 4 (portion 40).

In operation, the first portion 50 detects when the motor 2 starts to move the member 1, at the end of the predetermined blind time period after the motor 2 starts, picks (requests and obtains) the measured motor current to determine a reference value $i_A$ of the motor current, and then calculates a current threshold $i_t$ depending on the reference current value $i_A$ with the following formula $i_t=i_A+i_m$, where $i_m$ is a margin current that can be fixed (predetermined) or preferably equal to a correction factor multiplied by $i_A$, as previously described.

In operation, immediately after the blind time period ends and during the detection time period, typically in transient state of the motor 2 during the motor start-up, the second portion 51 compares currently measured values of the motor current and the threshold value $i_t$ in order to detect the possible occurrence of a pinch at the closing member 1 based on the comparison result.

The pinch detector 5 can be a functional element that is implemented by the controlling apparatus 4 executing a program for pinch detection. The present disclosure also concerns a non-transitory computer readable medium including program instructions which, when executed by a processor, cause the processor to execute the method for pinch detection.

Figure 2:
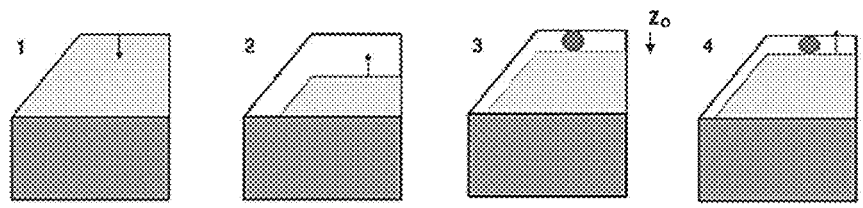
FIG. 2 represents a window movement scenario in which an obstacle is squeezed.

The pinch detector 5 allows to detect a pinch at the member 1, such as a window, in a window movement scenario similar to the one illustrated in FIG. 2 with the following successive stages: stage (1): the window opens completely from an initial position completely closed; stage (2): the window is moved up, in a closing movement, from its open position to an intermediate position not completely closed, stage (3): the window is stopped and stationary in the intermediate position not completely closed, and stage (4): an obstacle "O" having a given stiffness is placed in the left space between the window and the door frame and the window starts closing again.

The pinch detection algorithm has been tested for a window in a vehicle and for various operating conditions of battery voltage $V_{batt}$, object location $z_o$ ($z_o$ representing the vertical distance between the object and the top frame of the door) and object stiffness $k_o$. The results of these experiments in terms of motor current i and pinch force Fp are shown in FIGS. 8a to 8d. The references (1) and (2) represent respectively the blind time period and the detection time period. Horizontal lines indicate the current threshold $i_t$ for battery voltage $V_{batt}$ of 10, 13 and 16 V, respectively. In addition, the pinch force values $F_P$ at which the algorithm detected the compressed object are given on the graphs. The highest achieved pinch force measured in these experiments was 68 N. Such pinch detection gives a sufficient margin to prevent exceeding the allowable force of 100 N.

Figure 9:
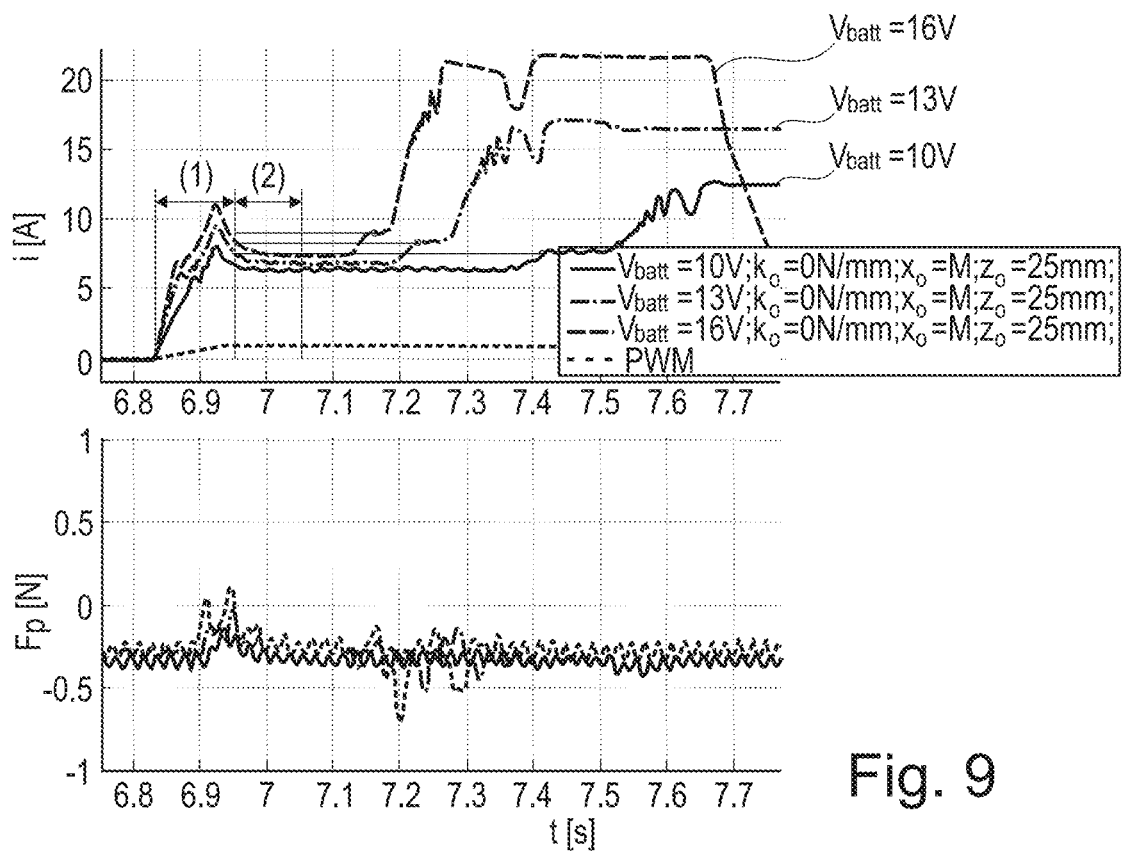
FIG. 9 shows the evolution over time of the motor armature current and the pinch force, in the same scenario of closing the window (as in FIGS. 8a to 8d), for various battery voltages, but without obstacle.

In addition, the same experiments were conducted for the case of closing the window 1 with different battery voltages (10V, 13V and 16V) but without obstacle ($k_o$=0 N/mm) are shown in FIG. 9. These conducted experiments show that, in the absence of an obstacle, no false pinch detection occurs.

Figure 10:
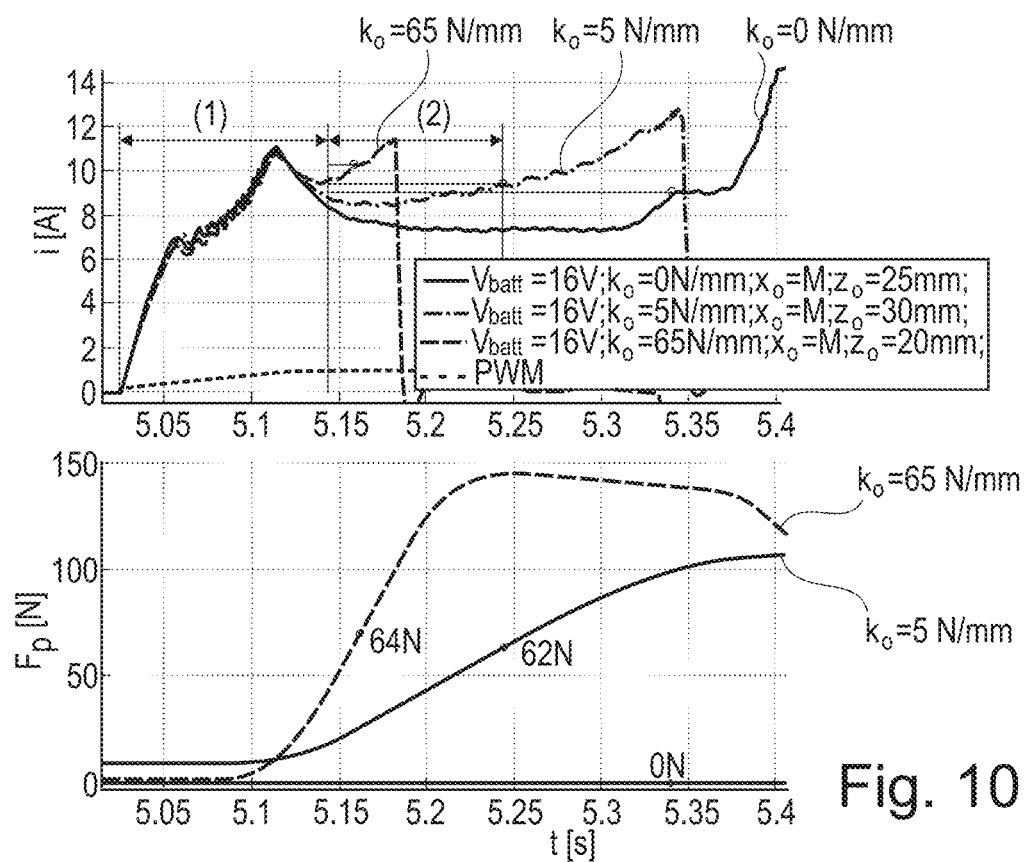
FIG. 10 shows the evolution over time of the motor armature current and the pinch force, in the same scenario of closing the window (as in FIGS. 8a to 8d), for one given battery voltage, with and without obstacle.

As a summary of the proper functioning of the present pinch detection algorithm, FIG. 10 shows the evolution over time of the motor current i and the pinch force $F_P$, for a battery voltage of 16 V, with an obstacle having a given stiffness $k_o$ (5 N/mm or 65 N/mm) and without obstacle ($k_o$=0 N/mm). The results show that, when an obstacle is squeezed, it is detected early when the pinch force has reached a value around only 60 N and, when no obstacle is present, no pinch is detected during the detection time period referenced as (2) in FIG. 10.

The presently disclosed pinch detection method works with a motor equipped with motor current measurement. It is efficient for detecting an obstacle (object) squeezed during motor start up in various external conditions of battery voltage, object stiffness and object position.

The present method for pinch detection is simple, fast and can be easily implemented. It is also self-adapting and robust with respect to external conditions such as battery voltage, obstacle stiffness, obstacle position. It meets the requirements of the automotive industry.

What is claimed is:

1. A pinch detector comprising a processor configured to:
when a motor starts closing a member, obtain, from a measuring circuit, a reference value of a motor current measured at an end of a blind time period having a predetermined duration from when the motor starts to close the member, the blind time period occurring after a peak of the motor current during an initial stage of the closing, the member being actuated by the motor that is equipped with the measuring circuit, the measuring circuit being configured to measure the motor current;
compare current values of the motor current to a threshold value during a detection time period that follows the blind time period and precedes a steady state time period of the motor, the threshold value being based on the reference value; and
detect a pinch at the member based on a current value of the current values being larger than the threshold value.

2. The pinch detector of claim 1, wherein:
the motor is supplied power by a pulse-width modulation (PWM) signal; and
the predetermined duration of the blind time period is set by a duration of a rise time period of a duty cycle of the PWM signal during motor start-up.

3. The pinch detector of claim 1, wherein:
the motor is supplied power by a pulse-width modulation (PWM) signal; and
the predetermined duration of the blind time period is set to a value that is more than a duration of a rise time period of a duty cycle of the PWM signal when the rise time period is below a minimum value.

4. The pinch detector of claim 1, wherein the processor is further configured to determine the threshold value by adding a current margin value to the reference value.

5. The pinch detector of claim 4, wherein the processor is further configured to calculate the current margin value by multiplying the reference value with a predetermined correction factor.

6. The pinch detector of claim 5, wherein the processor is further configured to set the predetermined correction factor to a value between 0.1 and 0.3.

7. The pinch detector of claim 1, wherein the pinch detector is included in a vehicle.

8. A system comprising:
a member configured to open and close;
a motor configured to actuate the member;
a measuring circuit configured to measure a current of the motor;
a pitch detector comprising a processor configured to:
when the motor starts closing the member, obtain, from the measuring circuit, a reference value of the current measured at an end of a blind time period having a predetermined duration from when the motor starts to close the member, the blind time period occurring after a peak of the motor current during an initial stage of the closing;
compare current values of the current to a threshold value depending on the reference value during a detection time period that follows the blind time period and precedes a steady state time period of the motor, the threshold value being based on the reference value; and
detect a pinch at the member based on a current value of the current values being larger than the threshold value; and a control apparatus configured to generate a control signal to stop movement of the member or reverse a direction of the movement of the member in response to detecting the pinch.

9. The system of claim 8, the system being included in a vehicle.

10. The system of claim 8, wherein:
the motor is supplied power by a pulse-width modulation (PWM) signal; and
the predetermined duration of the blind time period is set by a duration of a rise time period of a duty cycle of the PWM signal during motor start-up.

11. The system of claim 8, wherein:
the motor is supplied power by a pulse-width modulation (PWM) signal; and
the predetermined duration of the blind time period is set to a value that is more than a duration of a rise time period of a duty cycle of the PWM signal when the rise time period is below a minimum value.

12. The system of claim 8, wherein the processor is further configured to determine the threshold value by adding a current margin value to the reference value.

13. The system of claim 12, wherein the processor is further configured to calculate the current margin value by multiplying by the reference value with a predetermined correction factor.

14. The system of claim 13, wherein the processor is further configured to set the predetermined correction factor to a value between 0.1 and 0.3.

15. A method comprising:
when a motor starts closing a member, determining a reference value of a motor current measured by a measuring circuit at an end of a blind time period having a predetermined duration from when the motor starts to close the member, the blind time period occurring after a peak of the motor current during an initial stage of the closing, the member being actuated by the motor that is equipped with the measuring circuit, the measuring circuit being configured to measure the motor current;
comparing current values of the motor current to a threshold value during a detection time period that follows the blind time period and precedes a steady state time period of the motor, the threshold value being based on the reference value; and
detecting a pinch at the member based on a current value of the current values being larger than the threshold value.

16. The method of claim 15, wherein:
the motor is supplied power by a pulse-width modulation (PWM) signal; and
the predetermined duration of the blind time period is set by a duration of a rise time period of a duty cycle of the PWM signal during motor start-up.

17. The method of claim 15, wherein:
the motor is supplied power by a pulse-width modulation (PWM) signal; and
the predetermined duration of the blind time period is set to a value that is more than a duration of a rise time period of a duty cycle of the PWM signal when the rise time period is below a minimum value.

18. The method of claim 15, wherein the threshold value is determined by adding a current margin value to the reference value.

19. The method of claim 18, wherein the current margin value is calculated by multiplying by the reference value with a predetermined correction factor.

20. The method of claim 19, wherein the predetermined correction factor is set to a value between 0.1 and 0.3.

* * * * *